US00RE46004E

(19) United States
(12) Reissued Patent
Horng et al.

(10) Patent Number: US RE46,004 E
(45) Date of Reissued Patent: May 17, 2016

(54) LIGHT-EMITTING CHIP DEVICE WITH HIGH THERMAL CONDUCTIVITY

(71) Applicants: KABUSHIKI KAISHA TOSHIBA, Tokyo (JP); NATIONAL CHUNG HSING UNIVERSITY, Taichung (TW)

(72) Inventors: Ray-Hua Horng, Taichung (TW); Dong-Sing Wuu, Taichung (TW); Shao-Hua Huang, Pinghen (TW); Chuang-Yu Hsieh, Sanchong (TW); Chao-Kun Lin, San-Jose, CA (US)

(73) Assignee: KABUSHIKI KAISHA TOSHIBA, Tokyo (JP)

(21) Appl. No.: 14/121,840

(22) Filed: Oct. 23, 2014

Related U.S. Patent Documents

Reissue of:
(64) Patent No.: 7,858,999
Issued: Dec. 28, 2010
Appl. No.: 12/047,165
Filed: Mar. 12, 2008

(30) Foreign Application Priority Data

Sep. 21, 2007 (TW) ..... 096135296

(51) Int. Cl.
*H01L 29/22* (2006.01)
*H01L 33/22* (2010.01)

(52) U.S. Cl.
CPC ..... *H01L 33/22* (2013.01); *H01L 29/22* (2013.01)

(58) Field of Classification Search
CPC ..... H01L 29/22; H01L 33/22
USPC ..... 257/98
See application file for complete search history.

(56) References Cited

U.S. PATENT DOCUMENTS

| | | | | |
|---|---|---|---|---|
| 4,970,430 | A | 11/1990 | Kamogawa et al. | |
| 6,255,129 | B1 * | 7/2001 | Lin | H01L 33/20 257/100 |
| 6,759,685 | B2 | 7/2004 | Horng et al. | |
| 6,784,462 | B2 | 8/2004 | Schubert | |
| 8,895,332 | B2 | 11/2014 | Horng | |
| 2003/0032209 | A1 | 2/2003 | Yeh et al. | |

(Continued)

OTHER PUBLICATIONS

Wei Chih Peng & Yew Chung Sermon Wu, Enhanced Output in double Roughened GaN Light-Emitting Diodes via Various Texturing Treatments of Undoped-GaN Layer, Japanese Journal of Applied Physics, Val. 45, No. 10A, 2006, pp. 7790-7712.

(Continued)

*Primary Examiner* — Leonardo Andujar
(74) *Attorney, Agent, or Firm* — Hogan Lovells US LLP

(57) ABSTRACT

This invention provides a light-emitting chip device with high thermal conductivity, which includes an epitaxial chip, an electrode disposed on a top surface of the epitaxial chip and a U-shaped electrode base cooperating with the electrode to provide electric energy to the epitaxial chip for generating light by electric-optical effect. The epitaxial chip includes a substrate and an epitaxial-layer structure with a roughening top surface and a roughening bottom surface for improving light extracted out of the epitaxial chip. A thermal conductive transparent reflective layer is formed between the substrate and the epitaxial-layer structure. The electrode base surrounds the substrate, the transparent reflective layer and a first cladding layer of the epitaxial-layer structure to facilitate the dissipation of the internal waste heat generated when the epitaxial chip emitting light. A method for manufacturing the chip device of the present invention is provided.

12 Claims, 11 Drawing Sheets

(56) References Cited

U.S. PATENT DOCUMENTS

| | | | | |
|---|---|---|---|---|
| 2005/0116309 | A1 | 6/2005 | Ohyama et al. | |
| 2005/0285127 | A1 | 12/2005 | Noto et al. | |
| 2006/0091409 | A1 | 5/2006 | Epler et al. | |
| 2006/0237735 | A1 | 10/2006 | Naulin et al. | |
| 2007/0004066 | A1 | 1/2007 | Wuu et al. | |
| 2007/0166851 | A1 | 7/2007 | Tran et al. | |
| 2007/0272930 | A1* | 11/2007 | Tseng et al. | 257/79 |
| 2009/0127575 | A1 | 5/2009 | Horng | |

OTHER PUBLICATIONS

PCT search report of Nov. 18, 2008, PCT/US08/76773.

Wei Chih Peng & Yew Chung Sermon Wu, Performance of InGaN-GaN LEDs Fabricated Using Glue Bonding on 50-mm Si Substrate, 1041-11335, 2006 IEEE.

U.S. Appl. No. 12/039,563, filed Feb. 28, 2008, Ray-Hua Horng.

U.S. Appl. No. 12/701,336, filed Feb. 5, 2010, Ray-Hua Horng.

* cited by examiner

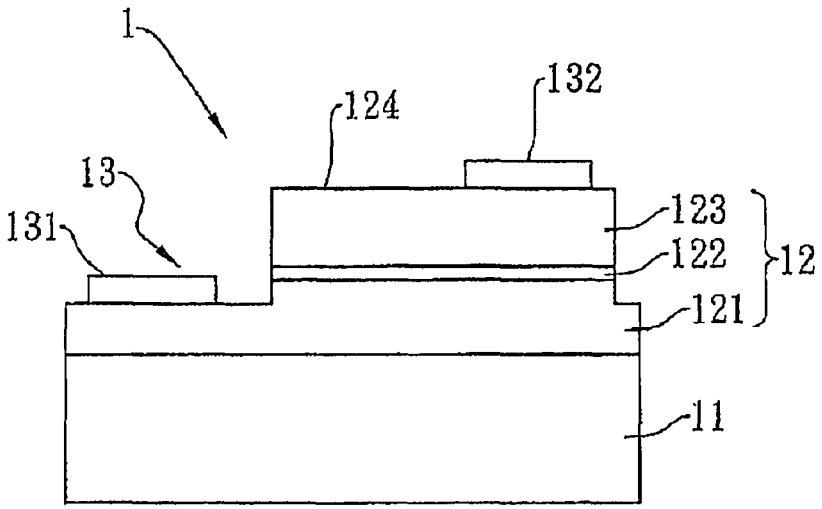
Fig. 1 -PRIOR ART-
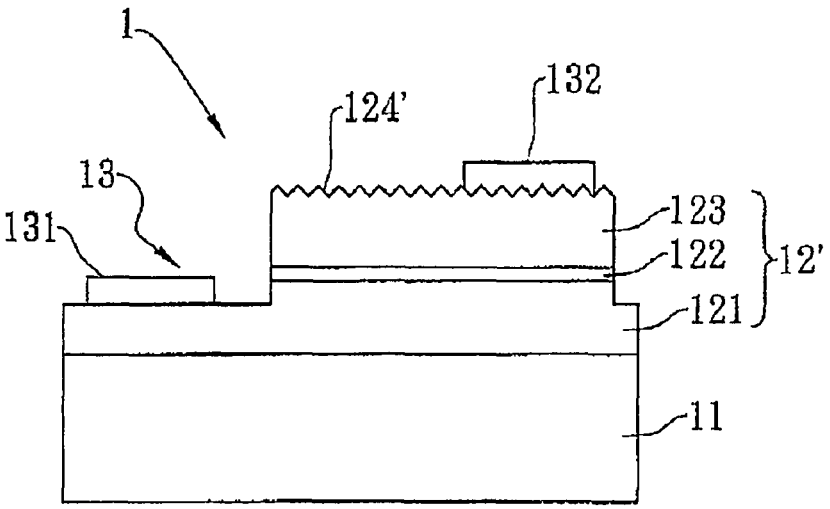
Fig. 2 -PRIOR ART-

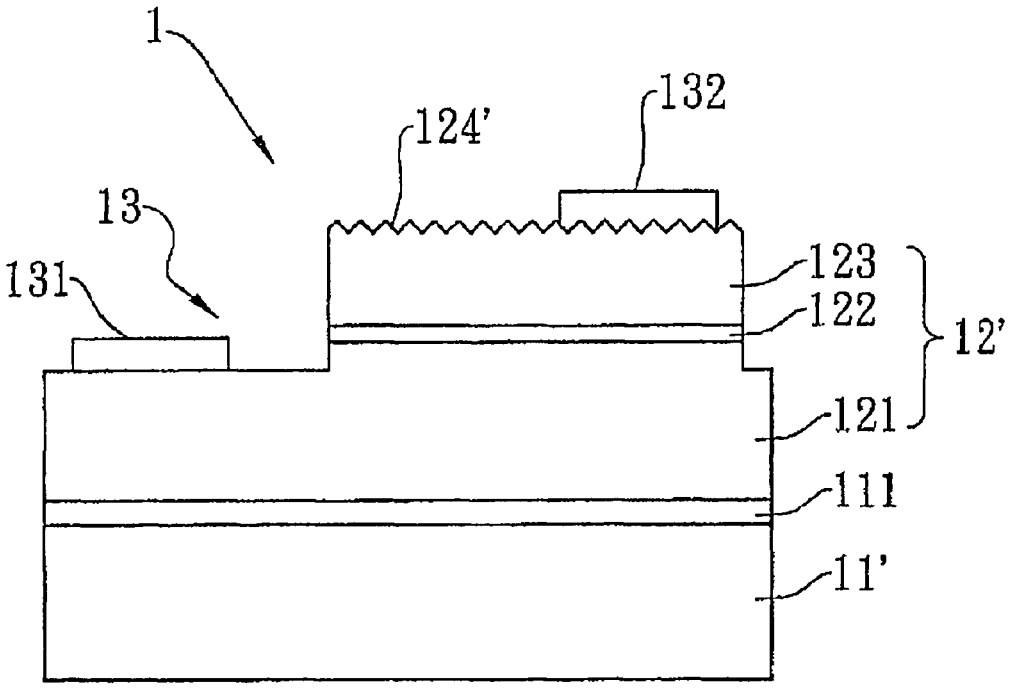
Fig. 3 -PRIOR ART-

LIGHT-EMITTING CHIP DEVICE WITH HIGH THERMAL CONDUCTIVITY

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

RELATED APPLICATION

This application claims priority, under 35 USC §119, from Taiwan Patent Application No. [096135297] *096135296* filed on Sep. 21, 2007, the content of which is incorporated herein by reference in its entirety.

BACKGROUND OF THE INVENTION

1. Field of the Invention

The present invention relates to a light-emitting chip device; and more particularly to a light-emitting chip device with high light extraction efficiency and high thermal conductivity.

2. Description of the Related Art

Please refer to FIG. 1, which shows a conventional light-emitting chip 1. FIG. 1 includes a substrate 11, an epitaxial-layer structure 12 on the substrate 11 and an electrode unit 13 constituted of an N-type electrode 131 and a P-type electrode 132.

As an example, the epitaxial-layer structure 12 is formed of GaN-based material and has an N-type first cladding layer 121, an active layer 122 formed on the first cladding layer 121 and a P-type second cladding layer 123. The first cladding layer 121 and the second cladding layer 123 are opposite to each other and form carrier injectors relative to the active layer 122. As such, when electric power is provided to the epitaxial-layer structure 12, electrons and holes would be recombined together and then release energy in a form of light emission.

The N-type electrode 131 and P-type electrode 132, for example, are formed of Au, Ni, Pt, Ag, Al, etc. and/or their alloy. The N-type electrode 131 is disposed on and forms ohmic contact with the first cladding layer 121 of the epitaxial-layer structure 12. The P-type electrode 132 is disposed on and forms ohmic contact with the second cladding layer 123 such that the N-type electrode 131 and P-type electrode 132 provide electric power supply to the epitaxial-layer structure 12.

When electric energy is supplied to the N-type electrode 131 and P-type electrode 132, current spreads and flows through the epitaxial-layer structure 12, and electrons and holes are injected into the active layer 122, recombining with each other and releasing energy in the form of light emission.

The refractive index of the GaN-based material is about 2.6, and the refractive index of its surrounding, which generally is air, is 1, or the surrounding is a transparent encapsulating material, used for packaging and having a refractive index between 1 and 2.6. The top surface 124 of the second cladding layer 123 of the epitaxial-layer structure 12 of the light-emitting chip 1 is a flat surface. Partial light generated from the epitaxial-layer structure 12, due to their propagation direction, would follow Snell's law and could not escape the epitaxial-layer structure 12 and enter the surrounding. As a consequence, the light extraction of the light-emitting chip 1 is not good.

Please refer to FIG. 2. There are literature and patents that propose roughing the top surface 124' of the light-emitting chip 1 to make the light impinging on the rough top surface 124' have various incident angles relative to the rough top surface 124'. The chance of light escaping the epitaxial-layer structure 12' is thus increased, and the light extraction efficiency is improved.

Nevertheless, the light generated from the epitaxial-layer structure 12' does not entirely propagate toward the top surface 124'. The light propagating toward the substrate 11 faces similar situation as that at the top and can not escape the epitaxial layer 12' and enter the surrounding. Thus, the light extraction is still low.

Please refer to FIG. 3. Some literature proposes to form a reflective mirror layer 111, which is connected to the epitaxial-layer structure 12', capable of reflecting light. Hopefully, the light propagating toward the substrate 11' can be reflected toward the top surface 124' to improve the possibility of light generated from the epitaxial-layer structure 12' to escape the epitaxial-layer structure and enter the surrounding. However, the light propagating toward the substrate 11' would be confined in the epitaxial-layer structure 12' due to their propagation directions and causes total internal reflection within the epitaxial-layer structure 12'. Furthermore, the light can be absorbed by the active layer 122. The reflective mirror layer 111 on the substrate 11' cannot substantially improve the light extraction of the light-emitting chip 1. When a roughened interface is formed between the epitaxial-layer structure 12' and the reflective mirror layer 111, and a low-refractive-index transparent material is added between them, the light entering the low-refractive-index transparent material from the epitaxial-layer structure 12' is easily reflected back, and the roughened interface would easily change the propagation of the reflected light. The total reflection within the epitaxial-layer structure 12' is eliminated. The light extraction thus can be increased.

Nevertheless, the N-type electrode 131 is disposed on the first cladding layer 121 and the P-type electrode 132 is disposed on the second cladding layer 123, both of them block some light emitted from the front side of the light-emitting chip 1, and resulting in the reduction of the light-emitting area. The brightness of the light-emitting chip 1 is lowered.

Besides, the internal waste heat converted from the light confined within the epitaxial structure 12' is dissipated through the substrate 11', and the dissipation efficiency is not good. The lifetime of the light-emitting chip 1 is adversely affected.

SUMMARY

One aspect of the present invention is to provide a light-emitting chip device with high light extraction efficiency and high thermal conductivity.

Another aspect of the present invention is to provide a method for manufacturing a light-emitting chip device with high light extraction efficiency and high thermal conductivity.

The light-emitting chip device with high light extraction efficiency and high thermal conductivity of the present invention includes an epitaxial chip, an electrode and a U-shaped electrode base.

The light-emitting chip includes a substrate, an epitaxial-layer structure capable of generating light by electro-optical effect on the substrate and a transparent refractive layer sandwiched between the substrate and the epitaxial-layer structure. The epitaxial-layer structure includes an N-type first cladding layer connecting to the transparent refractive layer and having a roughness not less than 100 nm root means squared (rms), a P-type second cladding layer having a roughness not less than 100 nm rms and an active layer sandwiched between the first cladding layer and second cladding layer. Root mean square means the average between the height deviations and the mean line/surface, taken over the evaluation length/area.

The electrode is disposed on and in ohmic contact with a top surface of the epitaxial-layer structure.

The U-shaped electrode base surrounds the substrate, the transparent refractive layer and the first cladding layer, and being in ohmic contact with the first cladding layer. The electrode base is in contact with the electrode to provide electric energy to the epitaxial chip for generating light.

In one aspect, the present invention provides a method for manufacturing a light-emitting chip device with high thermal conductivity, which includes steps of forming an epitaxial-layer structure on a substrate, performing a first roughening step, forming an electrode on the top surface of the epitaxial-layer structure, forming a provisional substrate on the top surface of the epitaxial-layer structure, removing the substrate under the epitaxial-layer structure, performing a second roughening step, attaching a substrate onto a bottom surface of the epitaxial-layer structure, removing the provisional substrate to form an epitaxial chip, attaching the epitaxial chip upside-down onto a supporting substrate, forming an electrode base surrounding the epitaxial chip opposite to the supporting substrate and removing the supporting substrate.

The light-emitting chip structure is formed on an epitaxial substrate with an epitaxial growth method. The epitaxial-layer structure includes an N-type first cladding layer, a P-type second cladding layer and an active layer sandwiched between the first cladding layer and second cladding layer.

The first roughening step is to roughen a top surface of the epitaxial-layer structure far away from the epitaxial substrate.

The electrode is formed on and in ohmic contact with the top surface of the epitaxial-layer structure.

The provisional substrate is separably attached onto the top surface of the epitaxial-layer structure.

The epitaxial substrate is separated from the epitaxial-layer structure to expose the bottom surface of the epitaxial-layer structure.

The second roughening step is to roughen the bottom surface of the epitaxial-layer structure.

The step of attaching a substrate onto a bottom surface of the epitaxial-layer structure is attaching the substrate onto the bottom surface of the epitaxial-layer structure by thermal conductive glue with a predetermined refractive index and transparent to the light generated from the epitaxial-layer structure.

The provisional substrate is removed to form an epitaxial chip.

The outer surface of the epitaxial chip is coated with an isolation glue, and exposing sidewalls of the first cladding layer. The epitaxial chip is attached upside-down onto the supporting substrate by the isolation glue.

The electrode base is formed by forming an electrically conductive and thermally conductive seed layer on exposed surfaces of the epitaxial chip and then forming an electrically conductive and thermally conductive electrode base layer from the seed layer to form the electrode base in ohmic contact with the first cladding layer.

The supporting substrate is removed to form the light-emitting chip device with high thermal conductivity of the present invention.

The present invention provides a manufacturing process to produce a light-emitting chip device with an epitaxial-layer structure having a roughened top surface and roughened bottom surface to facilitate the extraction of light from the chip device, and enhancing brightness of the chip device. The internal waste heat of the chip device can be directly dissipated through the electrode base such that the lifetime of the chip device is improved.

BRIEF DESCRIPTION OF THE DRAWINGS

FIG. 1 is a schematic cross-sectional view of a conventional light-emitting chip;

FIG. 2 is a schematic cross-sectional view of another conventional light-emitting chip with a roughened top surface;

FIG. 3 is a schematic cross-sectional view of another conventional light-emitting chip with a roughened top surface and a reflective layer;

DETAILED DESCRIPTION

The light-emitting chip with high thermal conductivity provided by the present invention will be described and explained in detail through the following embodiments in conjunction with the accompanying drawings. It should be noted that like elements in the following description are designated in the same numerals.

Figure 4:
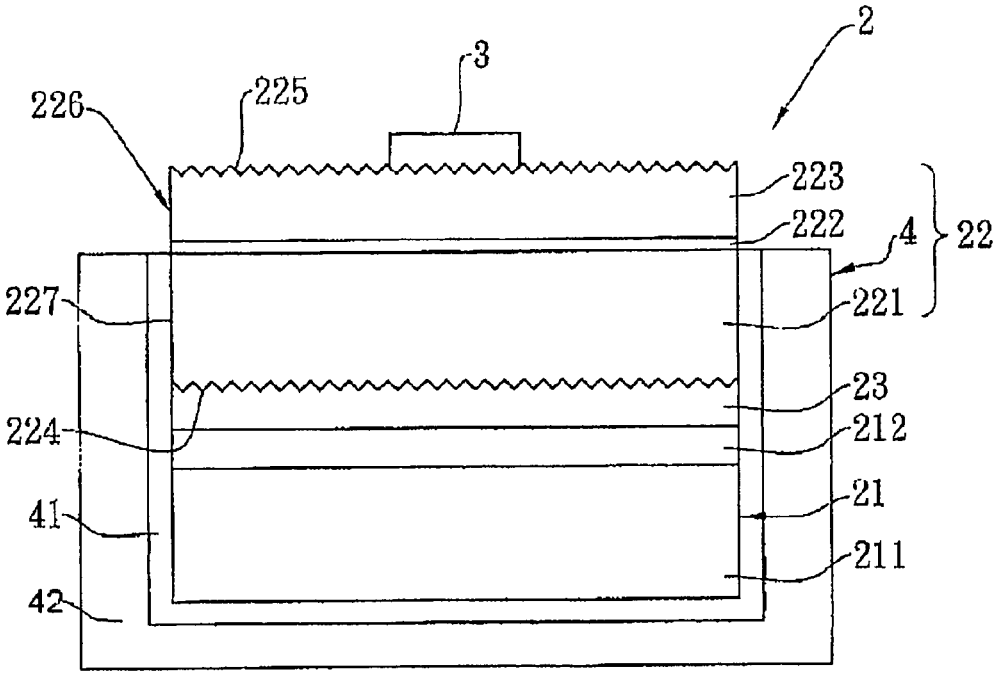
FIG. 4 is a schematic cross-sectional view of a light-emitting chip device with high thermal conductivity according to a preferred embodiment of the present invention.

Please refer to FIG. 4, which is a schematic cross-sectional view of the light-emitting chip device with high thermal conductivity of the present invention. The light-emitting chip device with high thermal conductivity of the present invention includes an epitaxial chip 2, an electrode unit 3 and an electrode base 4.

The epitaxial chip 2 includes a substrate 21, an epitaxial-layer structure 22 for generating light by electro-optical effect and a transparent refractive layer 23 joining the epitaxial-layer structure 22 and the substrate 21. The transparent refractive layer 23 is also thermally conductive.

The substrate 21 includes a bottom substrate 211 and a reflective mirror layer 212. The substrate 21 connects to the transparent refractive layer 23. The bottom substrate 211 is used for supporting the epitaxial-layer structure 22 and includes silicon, high thermally conductive ceramic or high thermally conductive metallic material. The reflective mirror layer 212 can be formed of Al, Ag, Au, Pt, Pd, Rb or a combination thereof, and also can be formed of high-refractive-index dielectric layers and low-refractive-index dielectric layers alternately disposed to each other. The reflective mirror layer 212 is used for reflecting the light propagating toward the substrate 21.

The epitaxial-layer structure 22 is formed of GaN-based semiconductor materials epitaxially grown on an epitaxial substrate 21, and then joining to the substrate 21 by the transparent refractive layer 23 (the detailed process will be described in the following). The epitaxial-layer structure 22 includes an N-type first cladding layer 221, a P-type second cladding layer 223 and an active layer 222 sandwiched between the first cladding layer 221 and second cladding layer 223. The first cladding layer 221 and second cladding layer 223 constitute quantum barriers relative to the active layer 222 such that the epitaxial-layer structure 22 can generate light by electro-optical effect.

The epitaxial-layer structure 22 has a roughened bottom surface 224 (i.e. the bottom surface of the first cladding layer 221) connecting to the transparent refractive layer 23. The bottom surface 224 of the epitaxial-layer structure 22 is roughened with wet etching. The epitaxial-layer structure 22 also includes a roughened top surface 225 (i.e. the top surface of the second cladding layer 223) with electrical conductivity opposite to the roughening bottom surface 224. The top surface 225 of the epitaxial-layer structure 22 is roughened by inductively-coupled plasma etching, wet etching or epitaxial growth. The epitaxial-layer structure 22 also includes a sidewall 226 (i.e., the sidewalls of the first cladding layer 221, the second cladding layer 223 and the active layer 222) connecting the bottom surface 224 and top surface 225. The sidewall 226 has an electrical conduction portion 227, which is extended upward from the periphery of the bottom surface 224 and has the same electrical conductivity with the bottom surface 224. Namely, the electrical conduction portion 227 is constituted by the sidewall of the first cladding layer 221.

The transparent refractive layer 23 has a refractive index between air and the substrate 21 and a light transmission percentage more than 50% for wavelength longer than 300 nm rms. The transparent refractive layer 23 joins the substrate 21 and the epitaxial-layer structure 22 together and has a thickness not more than 5 μm rms.

The electrode 3 is formed of Ag, Al, Au, Ti, Ni, Cr or their alloy. The electrode 3 is disposed on and in ohmic contact with the roughened top surface 225 of the epitaxial-layer structure 22.

The electrode base 4 surrounds the epitaxial chip 2 partially and includes a seed layer 41 and an electrode base layer 42. The seed layer 41 connects to exposed surfaces of the substrate 21, transparent refractive layer 23 and the electrical conduction portion 227 of the epitaxial-layer structure 22, as well as including an electrode base layer 42 extending from the seed layer 41.

The electrode base 4 is in ohmic contact with the electric conduction portion 227. The seed layer 41 is formed of high-thermally-conductive metallic material and has a reflectivity not less than 50%. The electrode base layer 42 has the same material as the seed layer 41, or has its alloy as the material. The electrode base 4 and electrode 3 cooperate with each other to provide electric energy to the epitaxial chip 2 for generating light.

When the electrode 3 and the electrode base 4 apply electric energy to the epitaxial chip 2, the electrode 3, the top surface 225 of the epitaxial-layer structure 22 (i.e. the top surface of the second cladding layer 223), the second cladding layer 223, the active layer 222, the first cladding layer 221, the sidewall of the first cladding layer 221 (i.e. the electrical conduction portion 227 of the sidewall 226 of the epitaxial-layer structure 22), and the electrode base 4 constitute an electrical conduction path to make the epitaxial-layer structure 22 generating light by electro-optical effect.

The light propagating upward through the roughened top surface 225 of the epitaxial-layer structure 22 would have various incident angles relative to the roughened top surface 225. The confinement of the light propagation governed by Snell's law is destroyed, and the chance of light escaping epitaxial-structure largely increases.

The light propagating downward through the roughening bottom surface 224 of the epitaxial-layer structure 22 (i.e. the bottom surface of the first cladding layer 221) also has various incident angles relative to the roughened bottom surface 224, and facilitating the light entering the transparent refractive layer 23. The transparent refractive layer 23 has a thickness not more than 5 μm rms and a refractive index between air and the substrate 21. The transparent refractive layer 23 forms a medium between the epitaxial-layer structure 22 and the reflective mirror layer 212 of the substrate 21. The light enters the interface of the transparent refractive layer 23 and the reflective mirror layer 212 is reflected back by the reflective mirror layer 212 and passing through the transparent refractive layer 23, the epitaxial-layer structure 22, and then entering the external. In other words, the light entering the transparent refractive layer 23 from the epitaxial-layer structure 22 is easily reflected back because the former has a refractive index lower than the latter. The roughened bottom surface 224 of the epitaxial-layer structure 22 would change the propagation direction of the reflected light, and hence increasing the chance of light escaping the epitaxial chip 2.

Besides, the light passing through the top surface 225 of the epitaxial-layer structure 22 is only blocked by the electrode 3 disposed thereon. The utilization of the emitting light from the epitaxial-layer structure 22 is improved compared to the conventional light-emitting chip device 1 shown in FIG. 1 through FIG. 3 that have two electrodes 131, 132 to cover some light-emitting areas, and resulting in the decrease of the utilization of the emitting light from the epitaxial-layer structure 12.

The U-shaped electrode base 4 is covering and connecting to the bottom surface and sidewall of the substrate 21, the sidewall of the transparent refractive layer 23, and the sidewall of the first cladding layer 221 of the epitaxial-layer structure 22 (i.e. the electrical conduction portion 227). The electrode base 4 has a large contact area with the epitaxial chip 2. The heat generated in the epitaxial chip 2 can be rapidly dissipated out through the electrode base 4. The lifetime of the light-emitting chip device of the present invention is improved. The deterioration of the reflective mirror layer 212 is avoided, and the stability of the light-emitting chip device of the present invention is maintained.

A method for manufacturing the light-emitting chip device will be described in detail in the following.

Figure 5:
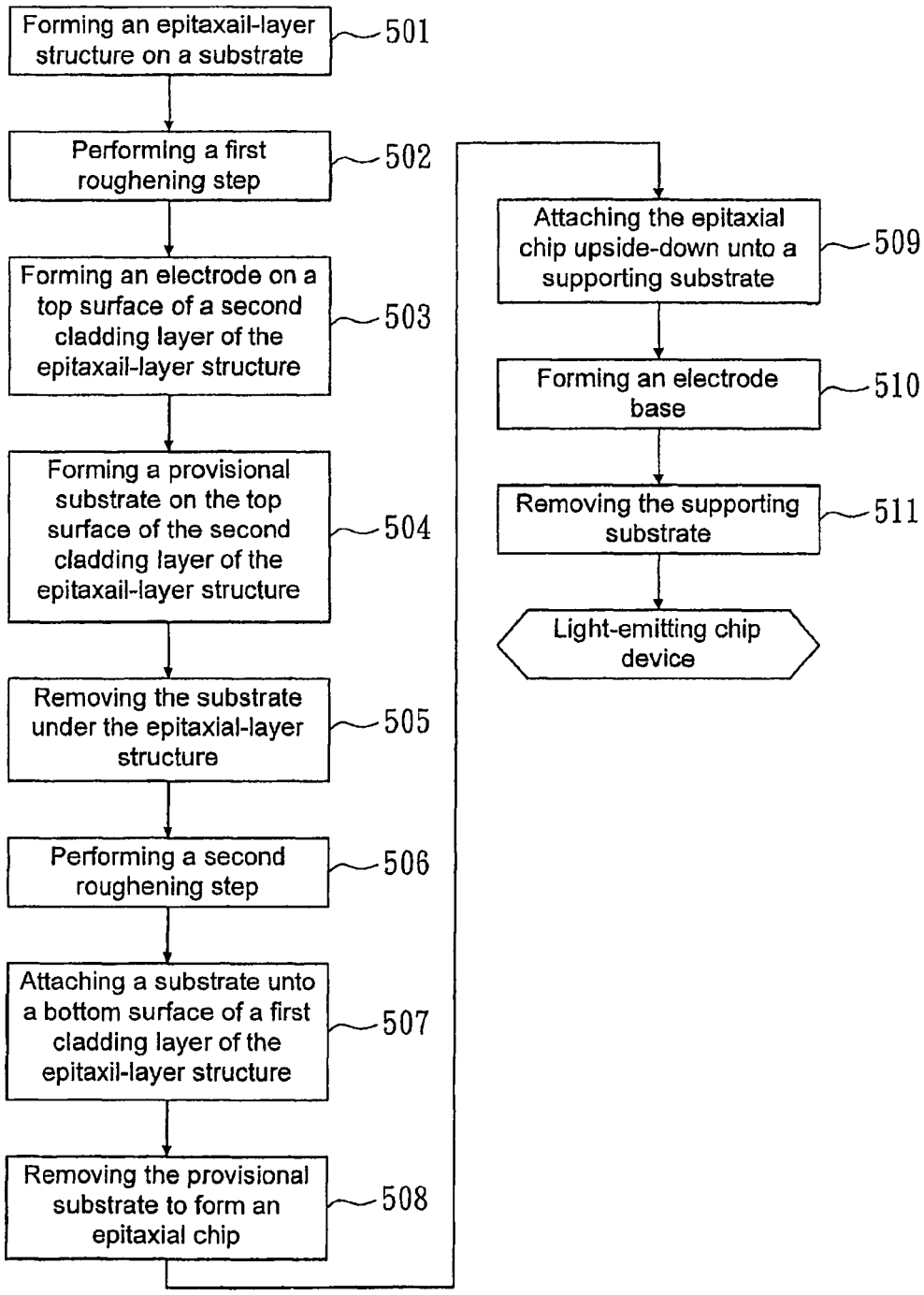
FIG. 5 is a process flow for manufacturing the light-emitting chip device with high thermal conductivity of FIG. 4; and FIG. 6 through FIG. 15 shows a schematic cross-sectional view of the light-emitting chip device corresponding to various steps of the process flow of FIG. 5.

Please refer to FIG. 5, the method for manufacturing the light-emitting chip device includes step 501 of forming an epitaxial-layer structure on a substrate, step 502 of performing a first roughening step, step 503 of forming an electrode on a top surface of a second cladding layer of the epitaxial-layer structure, step 504 of forming a provisional substrate on the top surface of the second cladding layer of the epitaxial-layer structure, step 505 of removing the substrate under the epitaxial-layer structure, step 506 of performing a second roughening step, step 507 of attaching a substrate onto a bottom surface of a first cladding layer of the epitaxial-layer structure, step 508 of removing the provisional substrate to form an epitaxial chip, step 509 of attaching the epitaxial chip upside-down onto a supporting substrate, step 510 of forming an electrode base, step 511 of removing the supporting substrate to obtain the light-emitting chip device.

Figure 6:
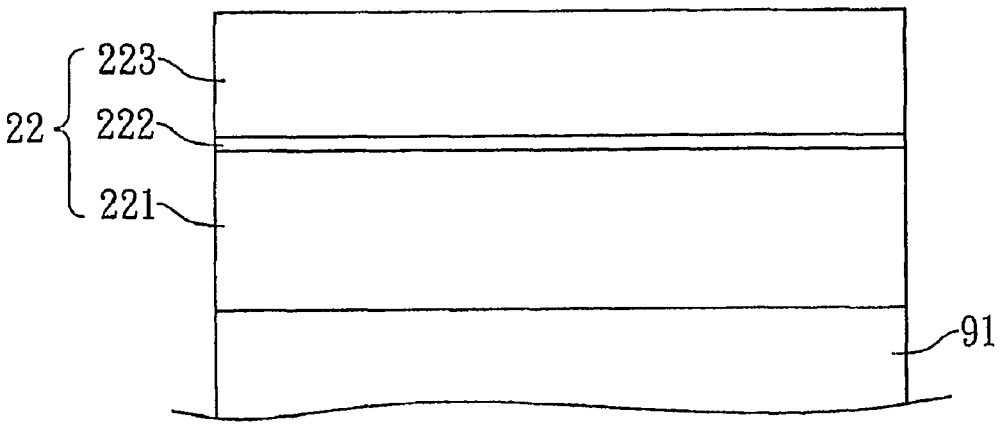

Please refer to FIG. 6, in step 501, the epitaxial-layer structure 22 from bottom to top including a first cladding layer 221, an active layer 222 and a second cladding layer 223 that epitaxially is grown on an epitaxial substrate 91. A GaN-based semiconductor material can epitaxially grow on the epitaxial substrate 91. The process for forming the epitaxial-layer structure 22 is well known, and will not be described again herein.

Figure 7:
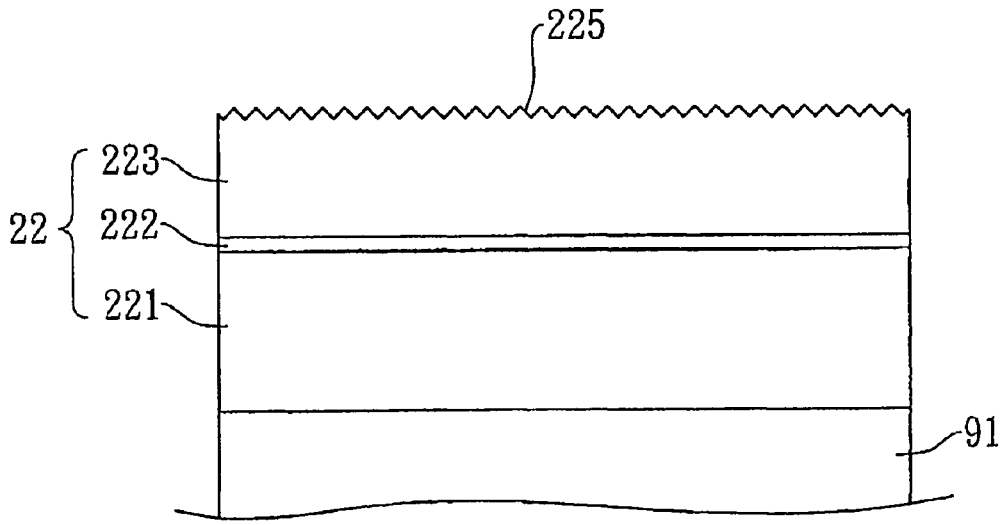

Please refer to FIG. 5 and FIG. 7, in step 502, the first roughening step is performed to roughen the top surface of the second cladding layer 223 of the epitaxial-layer structure 22 (i.e. the top surface 225 of the epitaxial-layer structure 22) by inductively-coupled plasma etching. The epitaxial-layer structure 22 also can form a roughened top surface by the epitaxial growth method.

Figure 8:
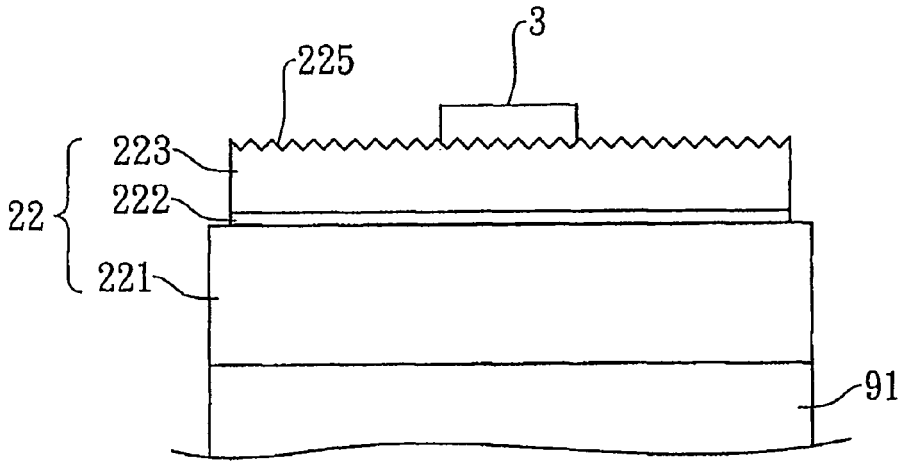

Please refer to FIG. 5 and FIG. 8, in step 503, the electrode 3 is formed on the roughened top surface 225 of the second cladding layer 223, and forming ohmic contact with the second cladding layer 223. The epitaxial-layer structure 22 is partially removed to form a mesa portion.

Figure 9:
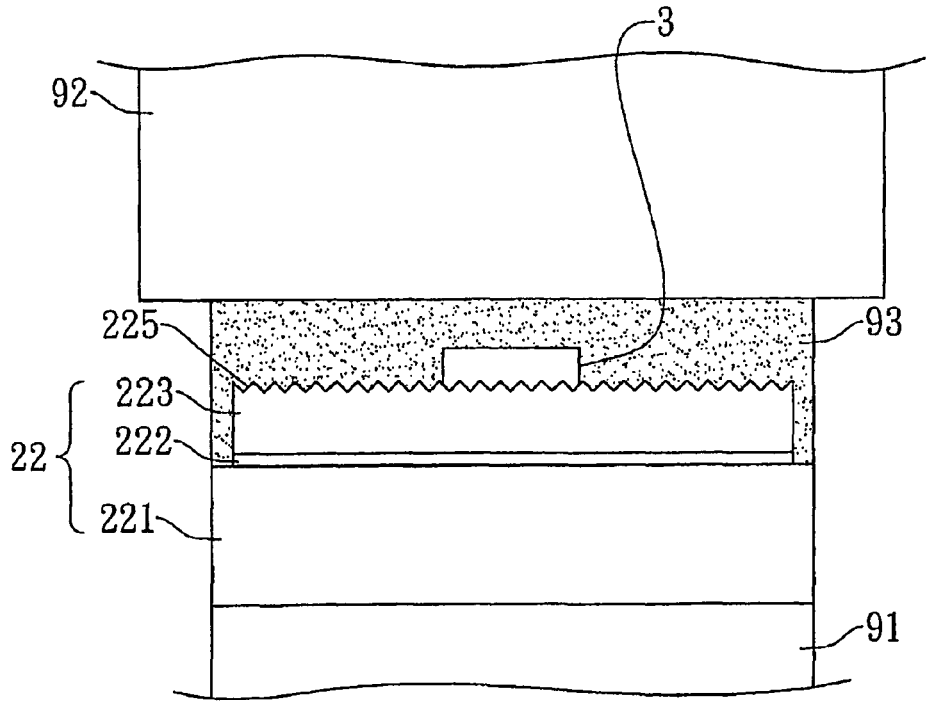

Please refer to FIG. 5 and FIG. 9, in step 504, a provisional substrate 92 is separatably attached onto the top surface 225 of the epitaxial-layer structure 22 with wax. Any removable glue also can be used instead of wax.

Figure 10:
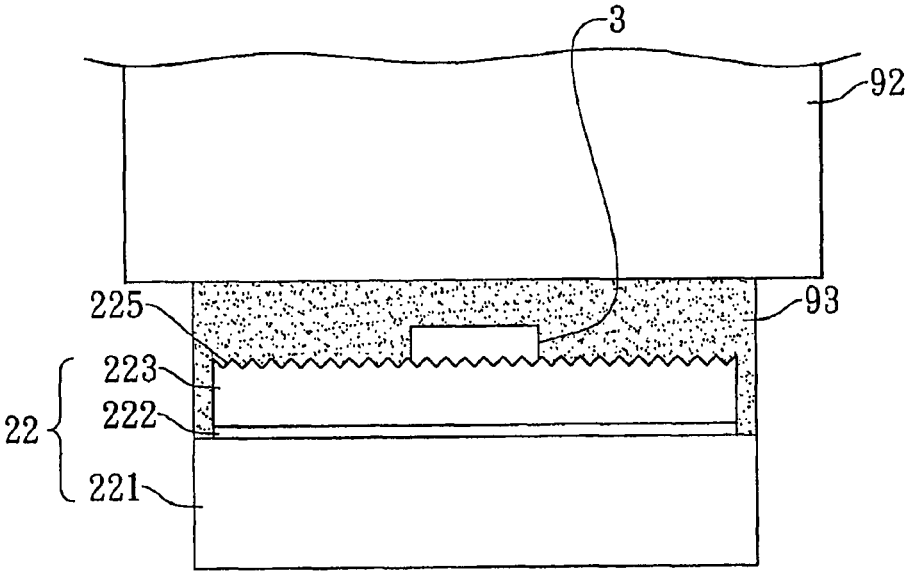

Please refer to FIG. 5 and FIG. 10, in step 505, the epitaxial substrate 91 is removed to expose the bottom surface of the first cladding layer 221.

Figure 11:
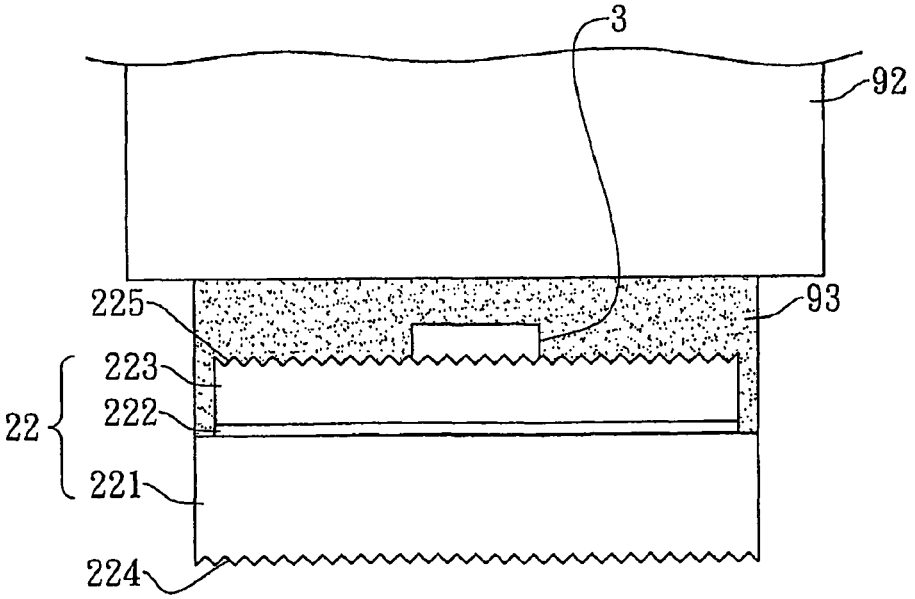

Please refer to FIG. 5 and FIG. 11, in step 506, the second roughening step is performed to roughen the bottom surface of the first cladding layer 221 with wet etching to form the roughened bottom surface 224 of the epitaxial-layer structure 22.

Figure 12:
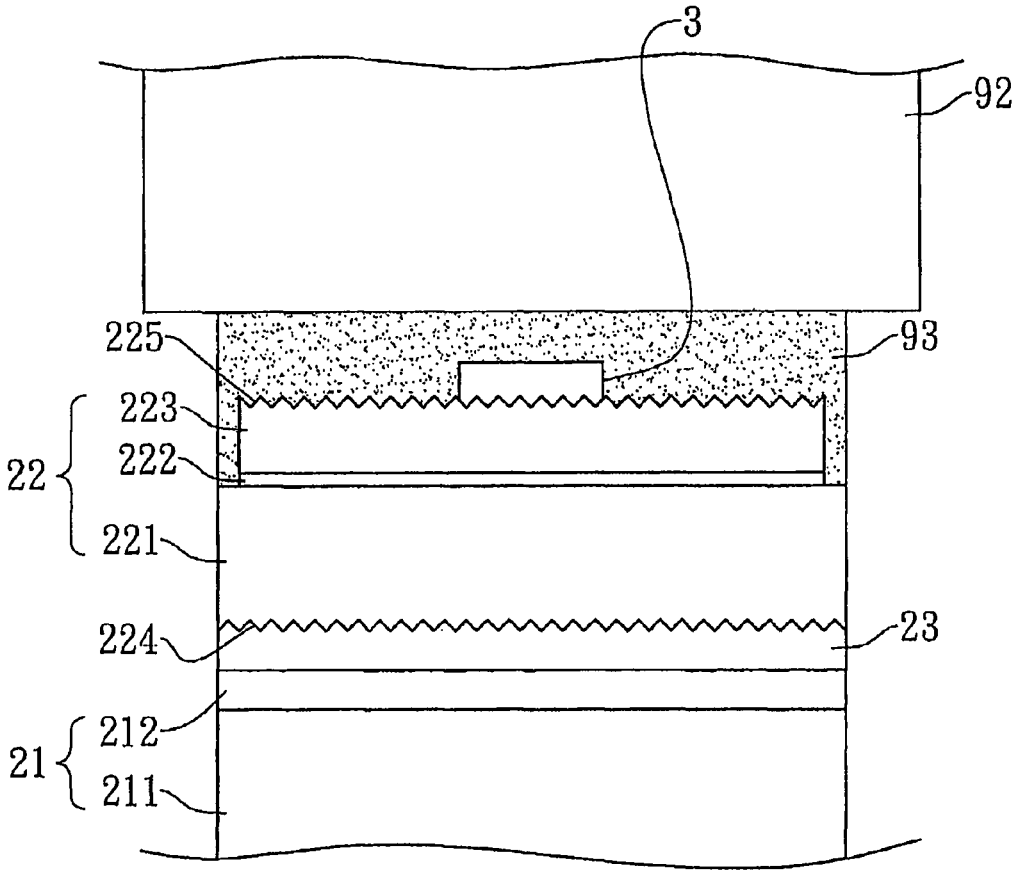

Please refer to FIG. 5 and FIG. 12, in step 507, the substrate 21 is attached to the bottom surface of the epitaxial-layer structure 22 with glue which has a predetermined refractive index and transparent to the light emitted from the epitaxial-layer structure 22. The glue is cured to become the transparent refractive layer 23. And the cured glue is controlled to have a thickness less than 5 μm rms so as to obtain best optical and thermal performance. The transparent refractive layer 23 also can be formed by film deposition on the bottom surface 224 of the first cladding layer of the epitaxial-layer structure 22. Then, the substrate 21 is attached to the transparent refractive layer 23. The substrate 21 can include a bottom substrate 211 and a reflective mirror layer 212 on the bottom substrate 211. The substrate 21 can be previously prepared by using a silicon substrate as the bottom substrate 211 and coating one or more layers of reflective material as the reflective mirror layer 212 on the silicon substrate.

Figure 13:
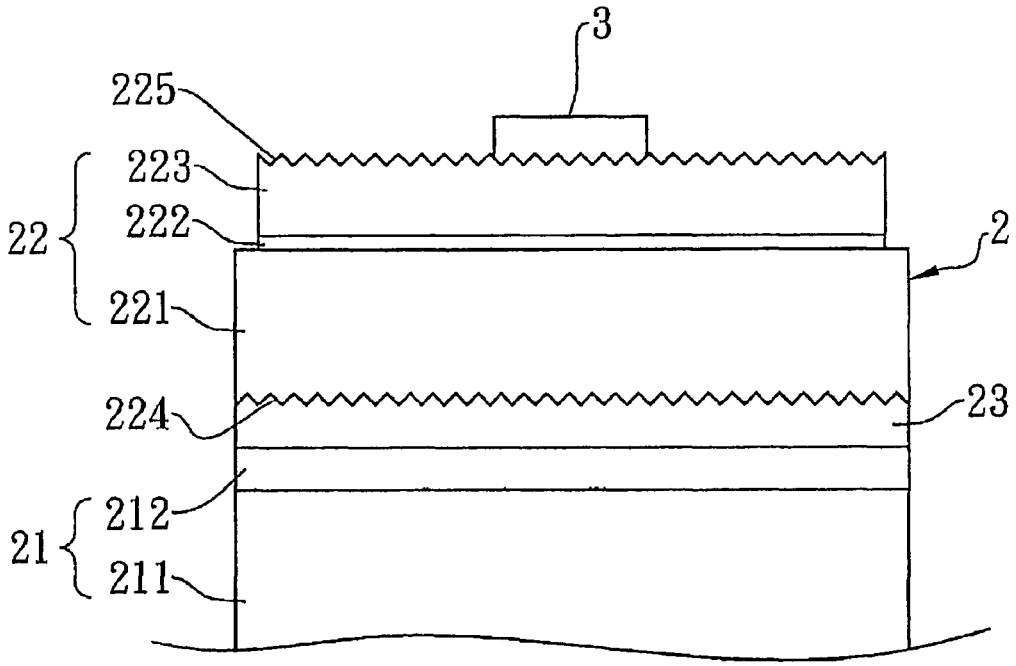

Please refer to FIG. 5 and FIG. 13, in step 508, the wax 93 is removed from the epitaxial-layer structure 22 so as to remove the provisional substrate 92. The residue of wax 93 left on the epitaxial-layer structure 22 is cleaned to expose the electrode 3.

Figure 14:
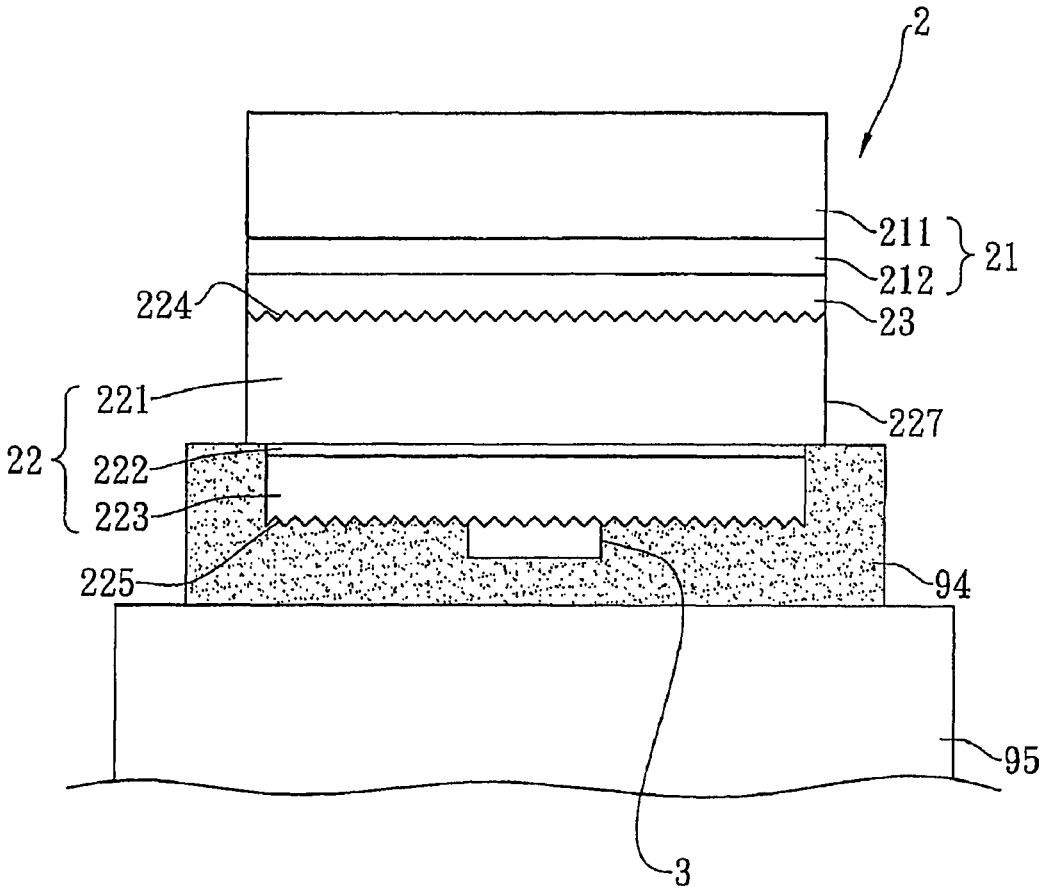

Please refer to FIG. 5 and FIG. 14, in step 509, the outer surface of the epitaxial-layer structure 22 of the epitaxial chip 2 is coated with protective glue 94 except that the electrical conduction portion 227 is exposed. The epitaxial chip 2 is upside-down separatably attached onto a supporting substrate 95 with the protective glue 94. The protective glue 94 can be wax for attaching the epitaxial chip 2 onto the supporting substrate 95, and also isolating the active layer 222 and the second cladding layer 223 to facilitate the formation of the electrode base 4.

Figure 15:
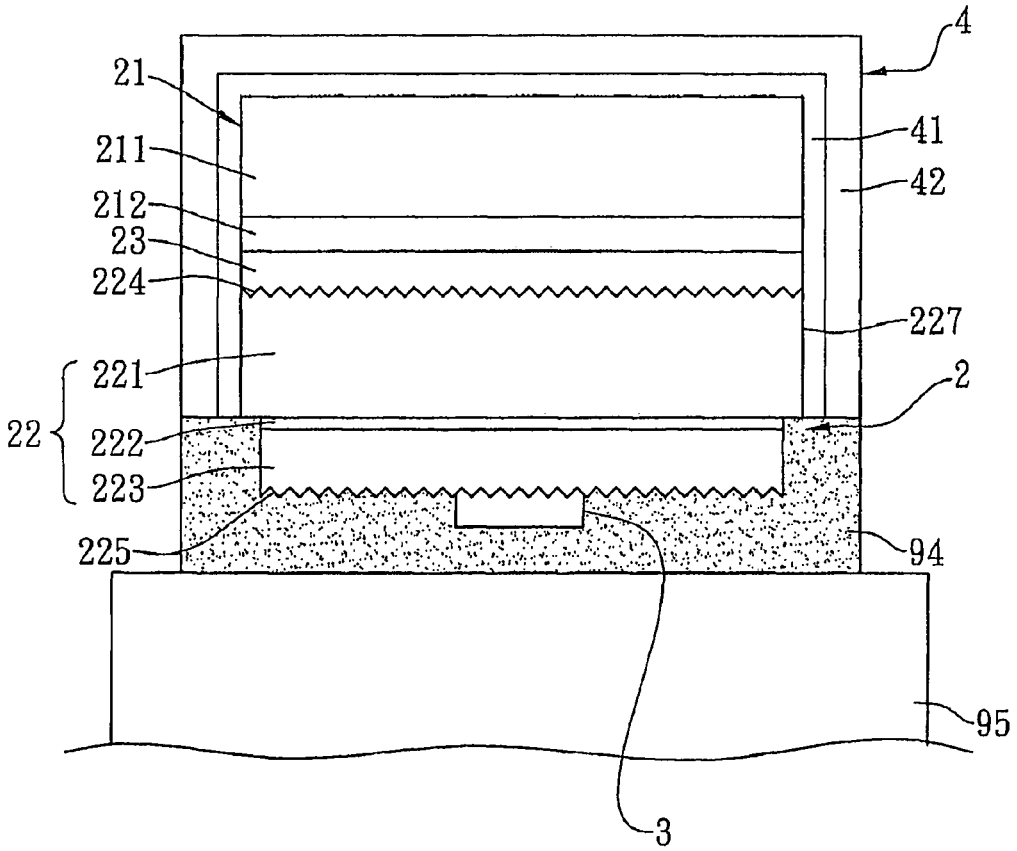

Please refer to FIG. 5 and FIG. 15, in step 510, a seed layer 41 is formed on the exposed surfaces of the epitaxial chip 2 (i.e. the exposed surfaces of the substrate 21, transparent refractive layer 23 and the electrical conduction portion 227 of the first cladding layer 221 of the epitaxial-layer structure 22). The seed layer 41 can be selected from electrically and thermally conductive material such as Cu, Ti, Au or Pt. Then, for example, an electroplating process is performed to form an electrically and thermally conductive electrode base layer 42 from the seed layer 41. The seed layer 41 and electrode base layer 42 constitute the electrode base 4.

Please refer to FIG. 5, finally, in step 511, the supporting substrate 95 and protective glue 94 are removed. The light-emitting chip device with high thermal conductivity is completed.

Additionally, a transparent electrical conductive layer 223 can be formed between the electrode 3 and the second cladding layer 223 of the epitaxial-layer structure 22 to spread current injected from the electrode 3 more uniformly. The quantum effect of the epitaxial-layer structure 2 is hence improved.

The light-emitting chip device of the present invention employs the roughened top surface 225 and roughened bottom surface 224 of the epitaxial-layer structure 22 to improve the light extraction from the chip device. The transparent refractive layer 23 with the predetermined thickness as an interface between the epitaxial-layer structure 22 and the substrate 21 can more effectively reflect the light propagating toward the substrate 21 back toward the top surface 225 to further improve the light extraction.

Furthermore, the U-shaped electrode base 4 largely increases thermal conductive area of the chip device, and the excess heat of the epitaxial-layer structure 22 can be rapidly dissipated through the electrode base 4. The lifetime of the chip device is improved. The deterioration of the reflective mirror layer 212 is avoided, and the stability of the chip device is maintained.

The electrode base 4 does not block the light emitting from the front side of the chip device. Compared to the conventional light-emitting device as shown in FIG. 1 through FIG. 3, the chip device of the present invention would have larger light-emitting area, and hence increasing the utilization of the emitting light. The brightness of the chip device is enhanced.

The examples given above serve as the preferred embodiments of the present invention only. The examples should not be construed as a limitation on the actual applicable scope of the invention, and as such, all modifications and alterations without departing from the spirits of the invention and appended claims, including other embodiments, shall remain within the protected scope and claims of the invention.

What is claimed is:

1. A light-emitting chip device with high thermal conductivity, comprising:

an epitaxial chip including a substrate and an epitaxial-layer structure capable of generating light by electro-optical effect on said substrate, said epitaxial-layer structure including a first cladding layer of first conductivity type having a bottom surface with a roughness not less than 100 nm rms corresponding to said substrate, a second cladding layer of second conductivity type opposite to said first conductivity type having a top surface with a roughness not less than 100 nm rms, and an active layer sandwiched between said first cladding layer and said second cladding layer;

an electrode disposed on and in ohmic contact with said top surface of said second cladding layer; and a U-shaped electrode base under said epitaxial chip and surrounding said substrate and said first cladding layer, such that said U-shaped electrode base covers and connects to at least a portion of a bottom surface of the substrate, said U-shaped electrode being in ohmic contact with said first cladding layer and in contact with said electrode to provide electric energy to said epitaxial chip.

2. The light-emitting chip device with high thermal conductivity as claimed in claim 1, further comprising a transparent refractive layer formed between said substrate and said epitaxial-layer structure and having a refractive index between that of air and said substrate.

3. The light-emitting chip device with high thermal conductivity as claimed in claim 2, wherein said transparent refractive layer has a thickness not more than 5 μm rms.

4. The light-emitting chip device with high thermal conductivity as claimed in claim 2, wherein said transparent refractive layer has a light transmittance greater than 50% for wavelength longer than 300 nm rms.

5. The light-emitting chip device with high thermal conductivity as claimed in claim 1, wherein said substrate includes a bottom substrate and a reflective mirror layer on said bottom substrate.

6. The light-emitting chip device with high thermal conductivity as claimed in claim 5, wherein said bottom substrate has a material formed of silicon, diamond or metal with high thermal conductivity, and said reflective mirror layer has a highly reflective metallic material or a combination of highly reflective metallic materials.

7. The light-emitting chip device with high thermal conductivity as claimed in claim 5, wherein said bottom substrate has a material formed of silicon, diamond or metal with high thermal conductivity and a thickness more than 50 μm rms, and said reflective mirror layer is formed of high-reflective-index dielectric layers and low-reflective-index dielectric layers alternately disposed to each other.

8. The light-emitting chip device with high thermal conductivity as claimed in claim 7, wherein said reflective mirror layer has a reflectivity not less than 50%.

9. The light-emitting chip device with high thermal conductivity as claimed in claim 1, wherein said U-shaped electrode base includes a seed layer and an electrode base layer extending from said seed layer, and said seed layer connects to exposed surfaces of said substrate and sidewalls of said first cladding layer.

10. The light-emitting chip device with high thermal conductivity as claimed in claim 9, wherein said seed layer is formed of a metallic layer with high thermal conductivity and said electrode base layer is formed of the same material as said seed layer or its alloy.

11. The light-emitting chip device with high thermal conductivity as claimed in claim 9, wherein said seed layer has a reflectivity not less than 50%.

12. The light-emitting chip device with high thermal conductivity as claimed in claim 1, wherein the first conductivity type is N-type or P-type.

* * * * *